United States Patent [19]

Boudreau

[11] Patent Number: 4,615,781
[45] Date of Patent: Oct. 7, 1986

[54] MASK ASSEMBLY HAVING MASK STRESS RELIEVING FEATURE

[75] Inventor: Robert A. Boudreau, Hampton, N.H.

[73] Assignee: GTE Products Corporation, Danvers, Mass.

[21] Appl. No.: 790,589

[22] Filed: Oct. 23, 1985

[51] Int. Cl.⁴ .......................................... C23C 15/00
[52] U.S. Cl. ............................. 204/192.15; 118/48; 118/49; 118/504; 118/505; 204/192 R; 204/298; 427/34; 427/66; 427/69; 427/82; 427/96; 427/109; 427/248.1; 427/250; 427/252; 427/272; 427/282
[58] Field of Search .................. 118/504, 505, 48, 49; 204/298, 192 R, 192 C; 427/248.1, 250, 96, 252, 82, 272, 109, 282, 69, 99, 66, 34

[56] References Cited

U.S. PATENT DOCUMENTS

| | | | |
|---|---|---|---|
| 3,510,349 | 5/1970 | Jones | 117/212 |
| 4,049,857 | 9/1977 | Hammer | 204/298 |
| 4,273,812 | 6/1981 | Tsutsui et al. | 427/248.1 |
| 4,322,277 | 3/1982 | Oprenko | 204/298 |
| 4,335,161 | 6/1982 | Luo | 427/86 |
| 4,344,988 | 8/1982 | Sono et al. | 427/248.1 |
| 4,391,034 | 7/1983 | Stuby | 204/298 |
| 4,437,966 | 3/1984 | Hope et al. | 204/298 |
| 4,511,599 | 4/1985 | Rustomji | 427/282 |

OTHER PUBLICATIONS

Ingle Rev. Sci. Inst. 45 (1974), pp. 1460-1461.
Addy et al. IBM Tech. Disc. Bull. 8 (Oct. 5) 1965, p. 719.

Primary Examiner—Arthur P. Demers
Attorney, Agent, or Firm—José W. Jimenez

[57] ABSTRACT

The present invention provides a means of relieving stress on an apertured mask, typically used to deposit thin-film structures on a glass substrate, such that the mask easily conforms to the substrate surface when the mask is in its hold down and patterning position during the deposition process. In particular, the present invention provides a mask assembly having a structurally relieved inner apertured mask portion from an outer mask portion that serves to eliminate wrinkles or crimps in the mask during deposition which may produce unacceptable blurs or shorts between thin-film structures. The stress relieving feature includes a slot which is disposed peripherally about the inner mask and two small segments providing the interconnection between the inner and outer mask of the mask assembly.

18 Claims, 7 Drawing Figures

MASK ASSEMBLY HAVING MASK STRESS RELIEVING FEATURE

CROSS REFERENCE TO CO-PENDING APPLICATIONS

In co-pending Application filed ("MECHANISM FOR AUTOMATIC PRECISE REGISTRATION OF SHADOW MASKED EL ELECTRODE PATTERNS", Boudreau et al), Ser. No. 790,695, there is defined a mechanism that allows for remote controlled total automatic registration of shadow masks to a substrate while being operated in an in-line deposition system.

In co-pending Application filed under ("MASK FOR PATTERNING ELECTRODE STRUCTURES IN THIN FILM EL DEVICES"—Robert Boudreau), Ser. No. 790,590, there is defined a mask structure and a method of fabricating electrode structures of a thin-film EL device that utilizes such a mask structure.

Both of the above applications are filed concurrently herewith and are assigned to the same assignee as the instant invention.

TECHNICAL FIELD

The present invention relates in general to thin-film display panels, and particularly to a mask assembly and its use in the fabrication of thin-film structures for a thin-film device.

BACKGROUND OF THE INVENTION

Thin-film display panels (such as LCD or electroluminescent) have been known to be very useful for displaying information inasmuch as the thin-film structure, including the cross electrodes, can be deposited on a glass substrate thereby providing a matrix display panel capable of being selectively energized to activate individual pixels thereon. One of the problems encountered in the manufacturing of thin-film display panels is the development of processes that pattern the thin-film electrode structures.

Most thin-film devices have had their thin-film electrode structures patterned either by a wet process known as photolithography or by shadow masking. Photolithography is very similar to processes used to develop photographs in that the deposit to be patterned is coated with light-sensitive material, which is then exposed to a negative or a positive pattern and then developed and later stripped in various corrosive developing solutions. The disadvantages of this method is that it is slow and labor intensive, and involves many steps, each one subject to failure or possible contamination of the thin-film device.

With respect to the use of shadow masking to deposit thin-film structures, reference is made to U.S. Pat. No. 4,335,161 to Fang C. Luo, entitled "THIN-FILM TRANSISTORS, THIN-FILM TRANSISTOR ARRAYS AND A PROCESS FOR PREPARING THE SAME". In summary, the Luo patent appears to disclose a method of preparing a thin-film transistor or an array of thin-film transistors by depositing in vacuum the different components through a single apertured mask wherein the apertured mask is moved in a predetermined pattern for the deposition of each of the components. In the process, semiconductor material is deposited through the mask and then the mask is moved in a direction a distance equivalent to the longest dimension of the openings in the mask. Throughout the thin-film transistor formation process the mask is moved several times in different directions. The assembly that is then formed is removed from the vacuum and the fabrication completed by techniques such as photolithography.

As in Luo, shadow masking is usually performed over small substrates with stiff masks that are manually clamped to ensure even contact with a particular substrate. This is a relatively slow process and usually requires breaking vacuum in the deposition chamber, resulting in some thin-film contamination. When depositing through a large area mask, it is common that the substrate is not perfectly flat or not level with respect to its surrounding substrate holder. The present invention addresses this and other problems arising from the difficulties of remote automatic handling of large area shadow masks in in-line deposition systems.

A method which would produce thin-film structures without the use of photolithography would be considered a significant advancement in the thin-film structure deposition art. In addition, it is also believed that a mechanism which would support the shadow mask while relieving stress in the mask during deposition would constitute a significant advancement in the art.

DISCLOSURE OF THE INVENTION

It is therefore a primary object of this invention to enhance the art of thin-film structure deposition and particularly that art involving thin-film display panels.

It is another object of this invention to provide a mask assembly for patterning thin-film structures in thin-film devices, particularly electrode structures in display panels.

Still another object of the invention is to provide a method of depositing a pattern of electrode structures, wherein the method involves the use of a mask assembly having a means of supporting the mask during deposition while relieving stress on the mask.

In accordance with one aspect of this invention, there is provided a mask assembly for patterning thin-film structures for a thin-film device having at least a substrate. The mask assembly comprises a metallic inner shadow mask portion having a predetermined pattern of apertures with a border portion disposed about the apertures. In addition, a metallic outer mask portion is located about and coplanar with the inner mask portion. Finally, the mask assembly includes means for supporting the inner shadow mask portion while relieving stress in the inner mask portion during deposition of the thin-film structures, the supporting means disposed between and in operative contact with the inner and the outer mask portions.

In accordance with another aspect of this invention, there is provided a method of depositing a pattern of thin-film structures for a thin-film device having at least a substrate. The method comprises the steps of providing a mask assembly comprising a metallic inner shadow mask portion having a predetermined pattern of apertures with a border portion disposed about the apertures, a metallic outer mask portion located about and coplanar with the inner shadow mask portion and means for supporting the inner shadow mask portion while relieving stress in the inner shadow mask portion during deposition of the thin-film structures, the supporting means disposed between and in operative contact with the inner and outer mask portions. The method further comprises the steps of positioning the mask assembly on one side of the substrate and positioning a magnet adjacent the side of the substrate opposite the mask assembly such that the inner shadow mask portion is held in operative contact with the substrate without causing stress on the inner mask portion. Finally, the method includes the step of vacuum depositing a thin-film structure material through the apertures of the inner mask portion, thereby forming the thin-film structures on the substrate.

BEST MODE FOR CARRYING OUT THE INVENTION

For a better understanding of the present invention, together with other and further objects, advantages and capabilities thereof, reference is made to the following disclosure and appended claims in connection with the above-described drawings.

The teachings of the present invention address a new problem that has arisen from the difficulties of remote automatic handling of large area shadow masks in an in-line vacuum deposition process. The present invention involves the separation of the masking assembly into two components, one that holds the shadow mask and another that does the patterning (i.e., the shadow mask). Because the part that does the patterning is structurally relieved from the component that holds the mask, the mask lays down and conforms to the substrate, producing a well-defined pattern. Without this separation, a blurred pattern results despite very difficult and careful alignment by the masking mechanism of the mask and substrate. With this separation, mechanical alignment is no longer a major factor and repeatable, well-resolved patterns can be deposited. Wrinkles in the patterning portion of the mask assembly of only a few thousandths of an inch produce unacceptable blurs and shorts between thin-film structures that serve as electrodes. Thin-film electrodes for thin-film devices are also difficult to pattern due to their geometry. The electrodes are usually very numerous, typically about 500 to 1000 in a pattern and are spaced only a few thousandths apart, carrying potentials of hundreds of volts different from each other and having electrode lengths of five to ten inches. I have discovered that by structurally relieving the center patterning portion of the masking assembly from its outer mechanical mounting area, most of the difficulties in the mask conforming to the substrate to obtain good patterns are eliminated.

Figure 1:
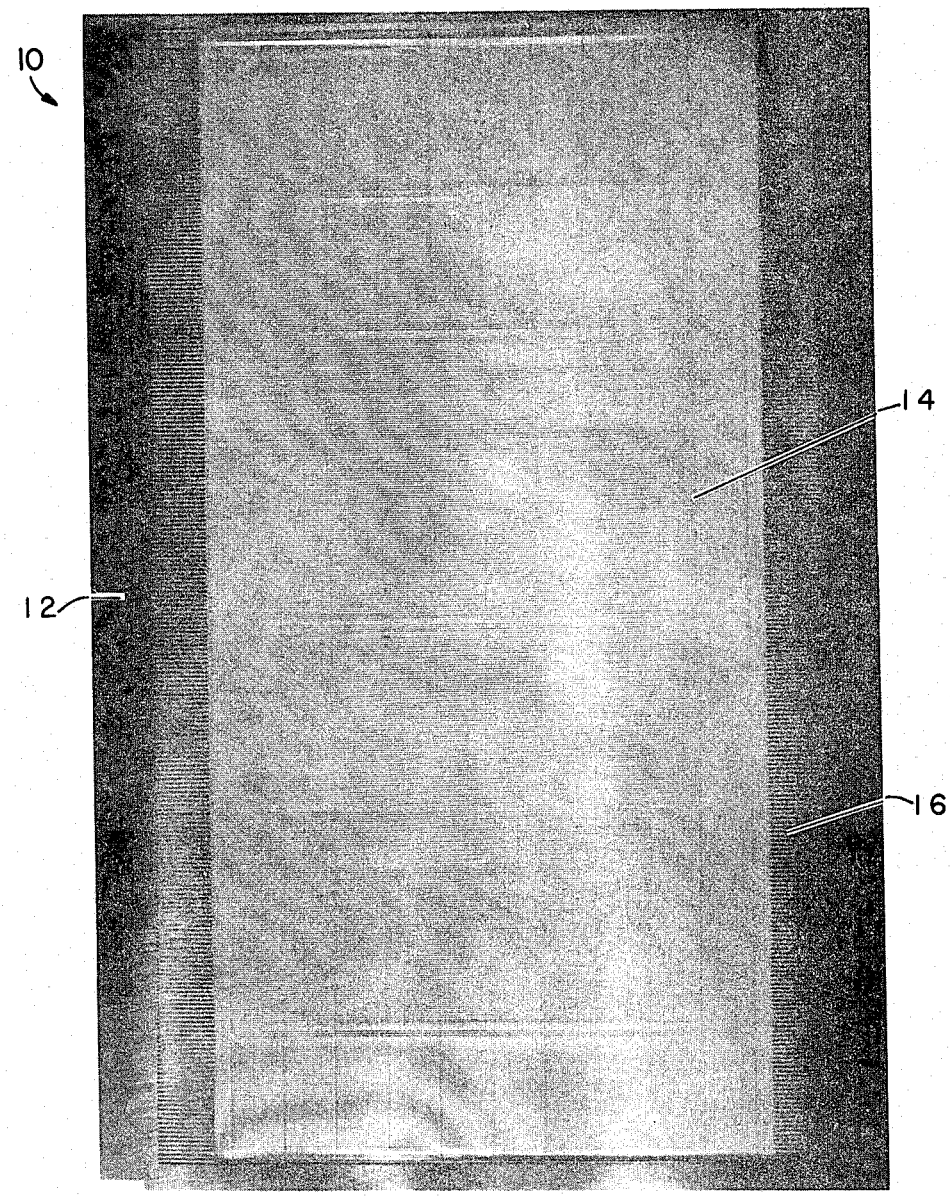
FIG. 1 illustrates an example of a shadow mask which can be used as part of the mask assembly of the present invention.

With particular attention to FIG. 1, there is illustrated a shadow mask 10 which is typically used in a deposition process to form thin-film structures in a thin-film device. The type of mask utilizing the teachings of the present invention is typically comprised of a thin sheet of metal having a predetermined pattern of apertures through which the thin-film structure material is to be deposited. In the present invention the example of a shadow mask used is a mask having a pattern of apertures for the purpose of forming thin-film structures in an electroluminescent device. Mask 10 is comprised of a border portion 12, and electrode-forming portion 14 and an electrode pad forming portion 16. Shadow mask 10 is made from a homogeneous piece of metal stock that has been etched using a photolithographic method.

Figure 2:
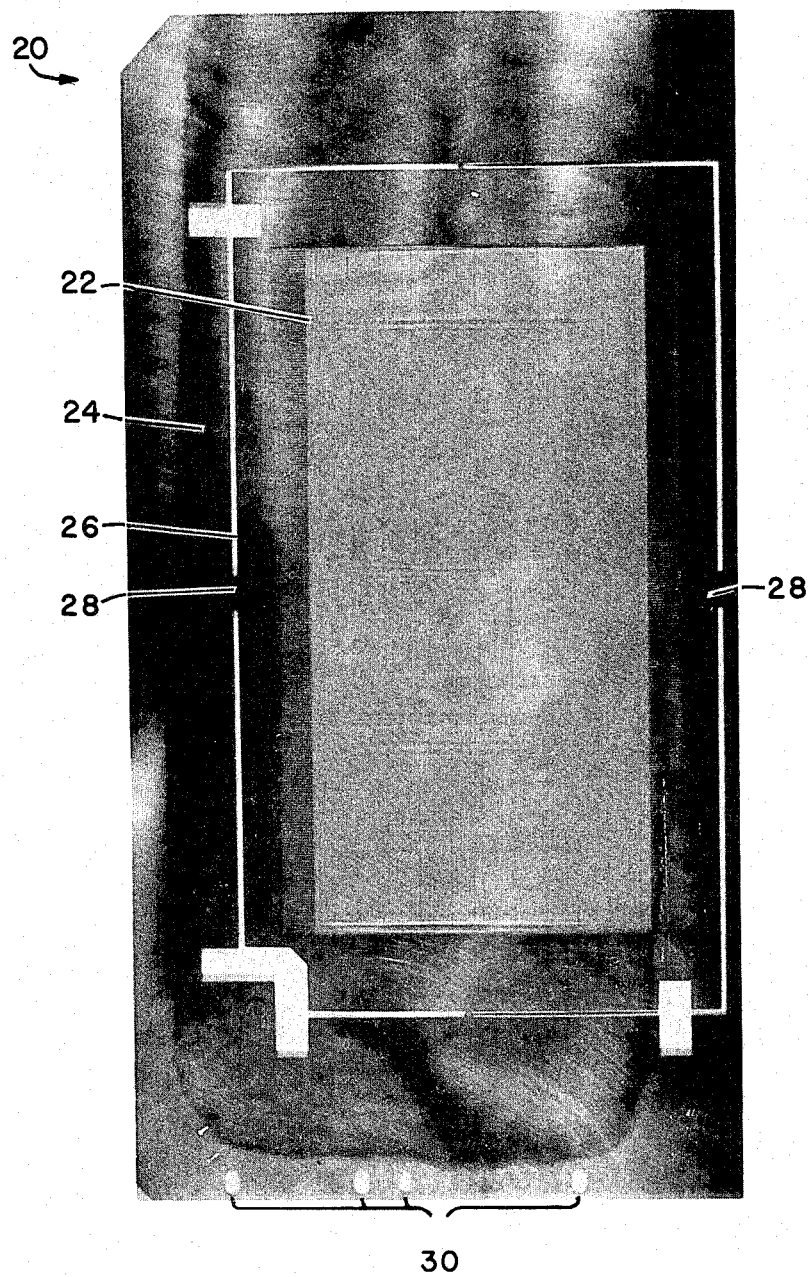
FIG. 2 is a photograph illustrating one example of a mask assembly for supporting a mask.

With respect to FIG. 2, there is illustrated a mask assembly 20 having a shadow mask as part thereof. Mask assembly 20 is comprised of a metallic inner shadow mask portion 22 having a predetermined pattern of apertures and a border portion disposed about the apertures (e.g., mask 10); a metallic outer mask portion 24 located about and coplanar with inner mask portion 22; and means for supporting the inner mask portion 22 while relieving stress in the inner mask portion during deposition of thin-film structures, the supporting means disposed between and in operative contact with the inner and outer mask portions. The supporting means of mask assembly 20 includes slot means 26 and connecting means 28, slot means 26 extending peripherally about the inner mask portion 22 and connecting means 28 disposed between and in contact with inner mask portion 22 and outer mask portion 24. Mask assembly 20 illustrates an example of how a shadow mask can be supported if the mask is to be positioned adjacent a substrate when a pattern is to be deposited on the substrate. FIG. 2 also illustrates mounting holes 30 which aid in supporting mask assembly 20 when used with deposition equipment in a deposition process.

With respect to supporting means of mask assembly 20, slot means 26 includes at least a thin, narrow slot etched in mask assembly 20 between border portion 12 of inner mask portion 22 and outer mask portion 24, the slot extending substantially about the periphery of the inner mask portion 22 (see FIG. 2). In FIG. 2 connecting means 28 includes two metallic segments adjoining the inner mask and the outer mask portions, each of the metallic segments disposed within slot means 26 and on opposite sides of the inner mask portion. In another embodiment of connecting means 28 it is possible to have at least a single metallic segment adjoining the inner mask and the outer mask portions, the segment being disposed within slot means 26. It is possible to vary the dimension and number of slots that can be etched into the mask assembly to increase the freedom of the inner mask portion still further. One could also use a permanent outer mask shaped fixture so that a separate inner mask might be bonded to it at only two small points, thereby eliminating the need to etch a slot in the metal portion of the mask assembly surrounding the inner mask. In every variation, however, there is the basic requirement of a separate mechanically relieved inner mask from its outer mask portion that is rigidly attached to the deposition equipment.

Figure 3:
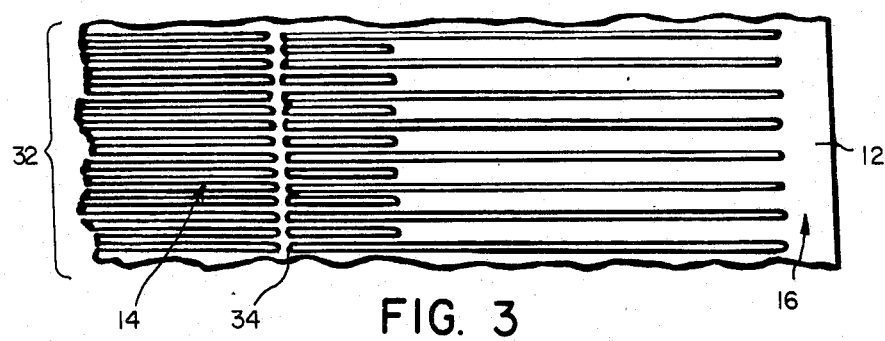
FIG. 3 is a figure of an enlarged sectional view of the mask illustrated in FIG. 1.
Figure 4:
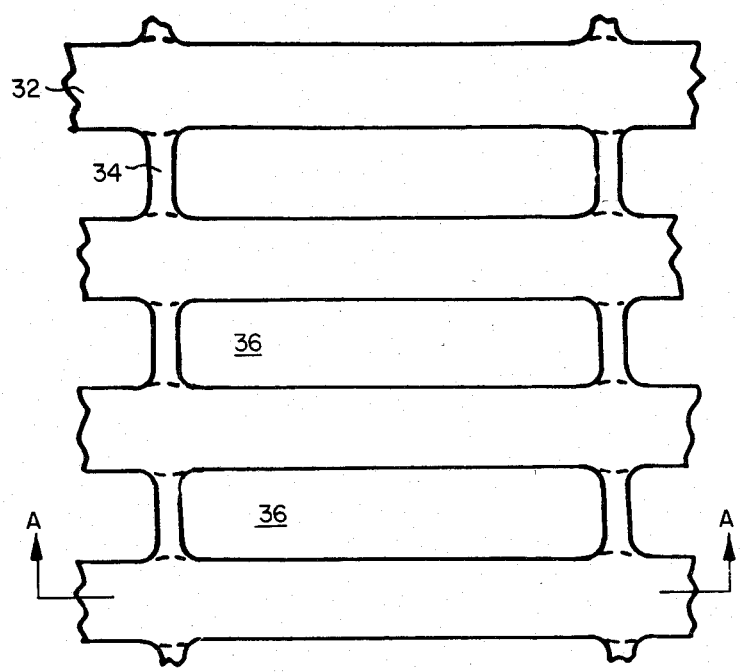
FIG. 4 is an enlarged sectional view of a portion of FIG. 3.
Figure 5:
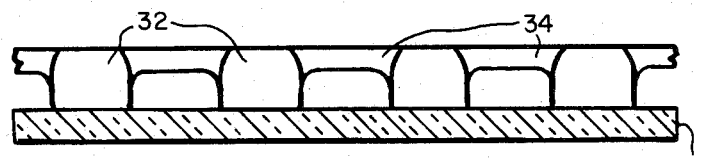
FIG. 5 is an enlarged illustration of the inner mask portion of the mask assembly of FIG. 2 in operative contact with a substrate.

Referring now to FIGS. 3 through 5, these figures illustrate enlarged sections of mask 10 for purposes of illustrating the structural aspects of masks of this type. FIG. 3 illustrates more closely border portion 12, electrode-forming portion 14 and electrode-pad-forming portion 16. Mask 10 structurally is comprised of a plurality of metallic strips 32 and a series of interconnecting arched bridges 34, that serve to define a predetermined pattern of elongated apertures. Border portion 12 is disposed about and is in contact with metallic strips 32. FIG. 4 illustrates an enlarged version of such strips 32 with interconnecting bridges 34 and elongated apertures 36. FIG. 5 illustrates the manner in which strips 32 are in operative contact with a substrate 38 when shadow mask 10 is positioned in operative contact with substrate 38. In addition, interconnecting arched bridges 34 provide support for strips 32 while being spaced from the surface of substrate 38. FIG. 5 also illustrates how the shadow mask can lay flat against the substrate if it is flexible with respect to the outer mask portion.

In forming mask assembly 20 a homogeneous piece of metal stock is etched using photolithographic type techniques to form the mask assembly illustrated in FIG. 2. Both inner and outer mask portions are made at the same time with one etching step. In forming the particular mask, illustrated in FIGS. 3-5, a differential etch is used which consists of etching halfway through a metallic sheet with a pattern of bridges from one side, and halfway through a metallic sheet with a metal pattern lacking bridges from the other side. This opens up the areas under and around bridges 34 with a structurally rounded profile (FIGS. 4 and 5). Since mask 10 is made from a single metal sheet (see FIG. 1), it will not delaminate and the mask can be made of materials which thermally match the expansion properties of the substrate on which the thin-film structures are to be deposited. In addition, the single metal mask can be made to be chemically resistant or to be magnetically attracted. Shadow mask 10 can provide a rounded profile to the shape of the material to be deposited on the substrate and will allow for a single, simple patterning process when compared to photolithography.

Figure 6A:
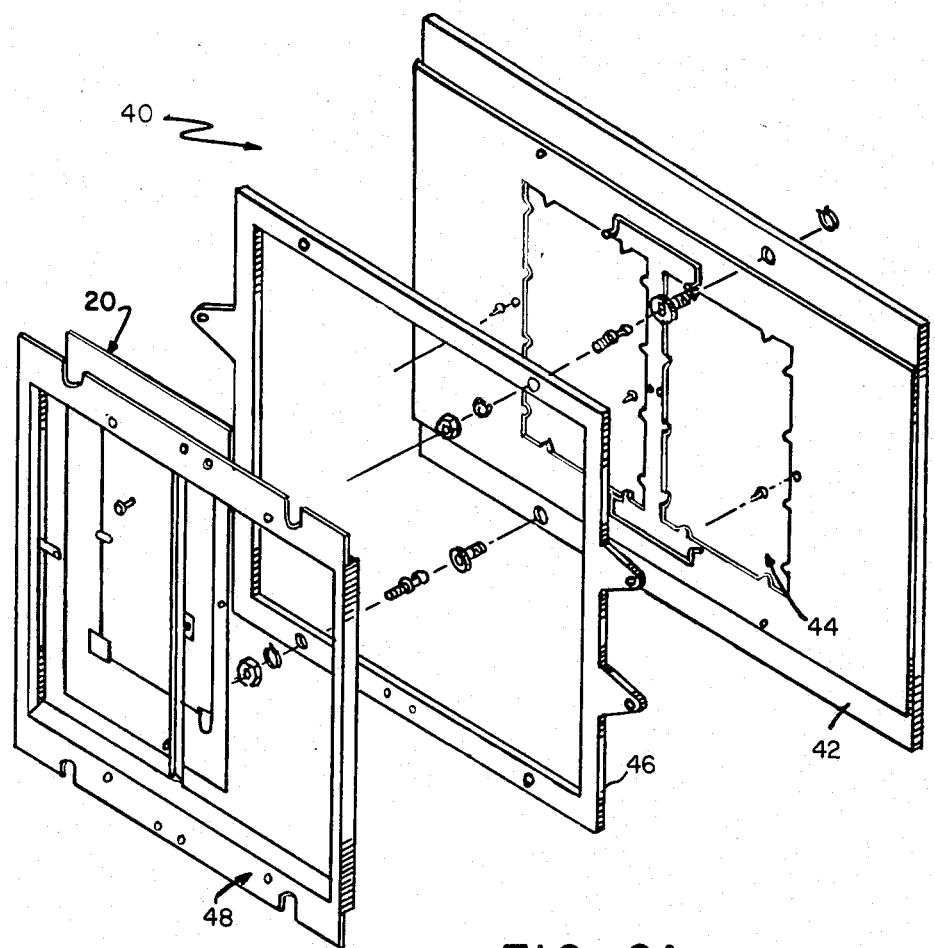
FIGS. 6A and 6B are examples of a mechanism for supporting the shadow mask against the substrate and placing such a mechanism in a sputtering system, respectively.
Figure 6B:
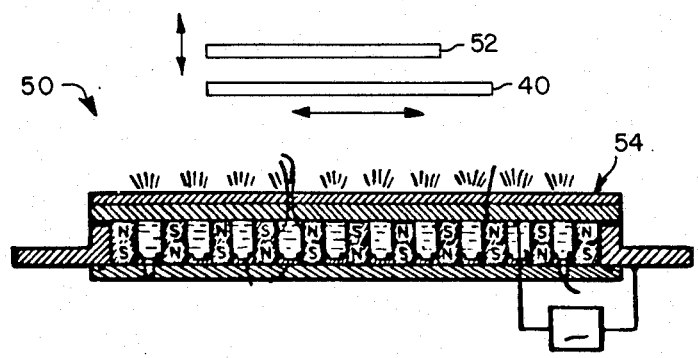

Referring now to FIGS. 6A and 6B, in FIG. 6A there is illustrated a mask registration mechanism 40 for supporting mask assembly 20 illustrated in FIG. 2 and to position inner mask portion 22 adjacent and in operative contact with a substrate on which the thin-film structures are to be deposited. Mechanism 40 is comprised of a substrate carrier 42, which supports (in this case) two substrates 44, a mask frame holder 46 and a mask frame 48. In FIG. 6B a deposition system is illustrated, including mechanism 40, containing substrates 44 and mask 10, that is exposed to a vacuum type deposition apparatus 50 on one side of substrate 44. On the other side of mechanism 40 there is shown a magnet 52 which is to be positioned adjacent and in operative contact with a portion of mechanism 40 in order to hold inner mask portion 22 against the substrate 44. For a more detailed description of the type of deposition apparatus 50, illustrated in FIG. 6B, refer to U.S. Pat. No. 4,437,966 issued to Hope et al, the subject matter of which is hereby incorporated by reference.

Referring to FIGS. 2 and 6A and 6B, a method for depositing a pattern of thin-film structures for a thin-film device having at least a substrate will be described. The aforementioned method comprises the steps of providing mask assembly 20 comprising metallic inner shadow mask portion 22 having a predetermined pattern of apertures and border portion 12 disposed about the apertures, metallic outer mask portion 24 located about and coplanar with the inner mask portion and means for supporting the inner mask portion while relieving stress in the inner mask during deposition of the thin-film structures, the supporting means disposed between and in operative contact with the inner and outer mask portions. In the next step, mask assembly 20 is positioned on one side of the substrate 44 (see FIG. 6A). In the next step, a magnet 52 is positioned adjacent the side of substrate 44 (see FIG. 6B) opposite the mask assembly 20 such that the inner shadow mask portion 22 is held in operative contact with substrate 44 (e.g., see FIG. 5) without causing stress on the inner mask portion. Finally, and as partially illustrated in FIG. 6B, the deposit material 54 is vacuum-deposited through mask assembly 20 and specifically, inner mask portion 22 through apertures 36 by using a deposition apparatus 50, thereby forming the thin-film structures on the substrate. The thin-film structure is completely deposited by a single pump down step, therefore, the mask assembly, and more specifically, the mask, need not be realigned.

When used in the deposition process, the mask assembly is mechanically brought to the surface of the glass substrate by movement of the mask frame holder 46, allowing inner mask portion 22 to flex itself to conform to the surface of glass substrate 44 as magnet 52 is energized to hold the inner mask against glass substrate 44. Accordingly, there is a minimum amount of interference from stress resulting from the imperfect attachment of the mask to the mask frame and frame holder and the ever present warpage of the substrate and carrier. Wrinkles that may be present in the mask may now work their way to the edge of the inner mask without binding to the outer mask. Additional advantages of the the present invention are that it protects the mask and mask assembly from physical damage, both in operator handling and by use in an automatic registration apparatus. The separation or slot between the inner and outer mask portions acts as a shock absorber to protect the inner mask portion so that the mask will lay flat on the substrate and not become permanently crimped if there are wrinkles present when applying the magnetic hold down prior to deposition. Numerous repeated, automatic mask operations utilizing a single mask with this feature have been successfully completed.

With respect to dimensions of the supporting means of mask assembly 20, slot means 26 may vary in thickness so long as the inner mask portion 22 is free to move with respect to the outer mask portion 24. With respect to connecting means 28, the width of the segments interconnecting the inner mask portion with the outer mask portion will vary in width, depending on the dimensions of the inner mask to be used. For instance, mask assembly 20 had inner mask portion 22 with the dimensions of about 9.5 inches by about 5.5 inches. The segments used had a maximum width of about 0.375 inches. The width may be larger, but a width larger than indicated would be too binding on the inner mask portion with respect to the outer mask portion for this size mask.

Smaller or larger masks would proportionately require smaller or larger segments respectively, but in every instance the segment width is kept to the minimum size that would allow control of the inner mask position.

The mask to be used in the aforementioned method could be as described in mask 10, for purposes of forming electrode structures in a thin-film device, but such an apertured mask could also be formed for purposes of forming thin-film structures such as electrode structures or electrode pad contacts. The vacuum-depositing step of the described method is principally sputtering, but may also include vapor deposition or chemical vapor deposition. The method described herein for depositing the thin-film structures on a substrate is performed in an in-line system and at no time does the system require breaking vacuum. The method described herein may also be used in a system which is not in-line, but as in such systems the risk involved is in contaminating the layers to be deposited on the substrate. Accordingly, the instant invention uniquely provides for a mask assembly and a method of utilizing such a mask assembly to produce thin-film structures within a thin-film device with only a single deposition step and without subjecting the shadow mask to stress caused by wrinkling or crimping during deposition. The aforementioned mask assembly and method, in addition, simplifies manufacturing of thin-film devices having such thin-film structures, and lowers the incidence of contamination in the thin-film device.

While there have been shown and described what are at present considered the preferred embodiments of the present invention, it will be obvious to one skilled in the art that various changes and modifications may be made therein without departing from the scope of the invention as defined by the appended Claims.

What is claimed is:

1. A mask assembly for patterning thin film structures for a thin film device having at least a substrate, said mask assembly comprising:
   a metallic inner shadow mask portion having a predetermined pattern of apertures with a border portion disposed about said apertures;
   a metallic outer mask portion located about and coplanar with said inner mask portion; and
   means for supporting said inner shadow mask portion while relieving stress in said inner mask portion during deposition of said thin film structures, said supporting means disposed between and in operative contact with said inner and said outer mask portions.

2. The mask assembly according to claim 1 wherein said supporting means includes slot means and connecting means, said slot means extending peripherally about said inner mask portion and said connecting means disposed between and in contact with said inner mask portion and said outer mask portion.

3. The mask assembly according to claim 2 wherein said slot means includes at least a thin, narrow slot etched in said mask assembly between said border portion of said inner mask portion and said outer mask portion, said slot extending substantially about the periphery of said inner mask portion.

4. The mask assembly according to claim 3 wherein said connecting means includes at least a single metallic segment adjoining said inner mask and said outer mask portions, said segment disposed within said slot means.

5. The mask assembly according to claim 3 wherein said connecting means includes two metallic segments adjoining said inner mask and said outer mask portions, each of said metallic segments disposed within said slot means and on opposite sides of said inner mask portion.

6. The mask assembly according to claim 1 wherein said outer mask portion has a series of mounting holes disposed about the periphery of said outer mask portion.

7. The mask assembly according to claim 1 wherein said inner mask portion is a mask for patterning electrode structures.

8. The mask assembly according to claim 7 wherein said electrode structures are made of a transparent metal oxide.

9. The mask assembly according to claim 7 wherein said electrode structures are made of a metallic material.

10. The mask assembly according to claim 7 wherein said inner mask portion is a mask for patterning electrode pad contacts.

11. A method of depositing a pattern of thin film structures for a thin film device having at least a substrate, said method comprising the steps of:
    providing a mask assembly comprising a metallic inner shadow mask portion having a predetermined pattern of apertures with a border portion disposed about said apertures, a metallic outer mask portion located about and coplanar with said inner shadow mask portion and means for supporting said inner shadow mask portion while relieving stress in said inner mask portion during deposition of said thin film structures, said supporting means disposed between and in operative contact with said inner and said outer mask portions;
    positioning said mask assembly on one side of said substrate;
    positioning a magnet adjacent the side of said substrate opposite said mask assembly such that said inner shadow mask portion is held in operative contact with said substrate without causing stress on said inner mask portion, and;
    vacuum depositing a thin film structure material through said apertures of said inner mask portion, thereby forming said thin film structures on said substrate.

12. The method according to claim 11 wherein said supporting means of said mask assembly includes slot means and connecting means, said slot means extending peripherally about said inner mask portion and said connecting means disposed between and in contact with said inner mask portion and said outer mask portion.

13. The method according to claim 12 wherein said slot means includes at least a thin, narrow slot etched in said mask assembly between said border portion of said inner mask and said outer mask portions, said slot extending substantially about the periphery of said inner mask portion.

14. The method according to claim 13 wherein said connecting means includes two metallic segments adjoining said inner mask and said outer mask portions, each of said metallic segments disposed within said slot means and on opposite sides of said inner mask portion.

15. The method according to claim 11 wherein said inner mask portion is a mask for patterning electrode structures.

16. The method according to claim 11 wherein said inner mask portion is a mask for patterning electrode pad contacts.

17. The method according to claim 11 wherein said method of depositing said thin film structure is performed in an in-line system.

18. The method according to claim 11 wherein said step of vacuum depositing includes sputtering, vapor deposition or chemical vapor deposition.

* * * * *